United States Patent [19]
Laskowsi

[11] 3,972,626
[45] Aug. 3, 1976

[54] AUTORANGING DIGITAL LUXMETER

[75] Inventor: Edward L. Laskowsi, Seven Hills, Ohio

[73] Assignee: General Electric Company, Schenectady, N.Y.

[22] Filed: June 17, 1975

[21] Appl. No.: 587,602

[52] U.S. Cl. .............................. 356/226; 250/214 P; 354/23 D
[51] Int. Cl.² ............................................ G01J 1/44
[58] Field of Search.................. 356/226; 354/23 D; 328/2; 250/214 P

[56] References Cited
UNITED STATES PATENTS

| | | | |
|---|---|---|---|
| 3,790,288 | 2/1974 | Hostetter | 356/226 |
| 3,843,265 | 10/1974 | Egli et al. | 356/226 |

FOREIGN PATENTS OR APPLICATIONS 2,006,025  8/1971  Germany ........................... 356/226

*Primary Examiner*—John K. Corbin
*Assistant Examiner*—Stewart Levy
*Attorney, Agent, or Firm*—Paul F. Wille; Lawrence R. Kempton; Frank L. Neuhauser

[57] ABSTRACT

An autoranging digital luxmeter is disclosed in which the current from a photocell is converted into a voltage by cascaded, variable gain amplifiers. The output of the amplifiers is coupled by a sample-and-hold circuit to an analogue-to-digital converter, the output of which is a digital representation of lux. The output of the amplifiers is also connected to limit comparison circuitry which, by way of an up-down counter, varies the gain of one or both of the amplifiers.

6 Claims, 9 Drawing Figures

PRIOR ART

AUTORANGING DIGITAL LUXMETER

BACKGROUND OF THE INVENTION

This invention relates to an automatic isocandle plotting system and, specifically, to an autoranging digital luxmeter for such a system. This application relates to application Ser. No. 587,603, filed concurrently herewith and assigned to the assignee of the present invention.

In the prior art, the testing of beam projector lamps, e.g., photographic projection lamps and automotive headlamps, has been a time-consuming and tedious process. Typically, the measurements are made manually by positioning the lamp, monitoring the voltage across the lamp, and recording the current from a photocell. The current from the photocell is then converted, by way of a look-up table, into illuminance or candlepower.

Depending upon the particular test being carried out, this procedure can take as long as 1½ days for a single lamp. For example, the beam pattern of an automotive headlamp is given by what is known as an isocandle curve, in which a plurality of closed curves indicate the coordinates in space where the illumination is the same. To obtain these curves, the above procedure is repeated for each of a large number of points and the closed curves drawn to include the points.

Another test, involving fewer points but generally requiring 1 to 2 hours per lamp to complete, is the test for compliance with the S.A.E. (Society of Automotive Engineers) standards for headlamps. In this test, the beam pattern is checked at 14 locations for maximum or minimum illumination.

In general, it is desired to reduce the time required for these tests and to provide more precise information about the beam pattern. To this end, various systems have been proposed in the past. One such system utilizes a lamp positioning mechanism controlled by photocell detection circuitry. The circuitry monitors the current generated by a photocell and positions the lamp so that the photocell receives the same level of illumination as the beam is moved. Electric signals indicative of position control the position of a pen in a plotting mechanism to draw the isocandle curves. While faster than the manual procedure, the system is relatively slow. Further, the S.A.E. points are not evaluated except by chance.

Considering digital luxmeters per se, some commercially available units are capable of providing very accurate and precise readings of illumination, but at the expense of the time it takes to make the measurement.

In general, the luxmeters of the prior art do not provide a rapid measurement of a large number of points necessary to define a beam pattern, cannot respond to rapid changes in light levels, are incapable of interfacing with a computer and, in particular, are incapable of providing accurate, precise measurements at a rate sufficient to be used "on-line" with a computer, i.e., so the computer does not have to wait for information.

SUMMARY OF THE INVENTION

In view of the foregoing, it is therefore an object of the present invention to provide a luxmeter capable of rapid measurement of illumination.

Another object of the present invention is to provide a luxmeter capable of operating on-line with a digital computer.

A further object of the present invention is to provide a digital luxmeter capable of measuring a beam pattern at more points in the pattern and in less time than has been provided in the prior art.

Another object of the present invention is to provide a wide range, high speed digital luxmeter.

A further object of the present invention is to provide a luxmeter capable of responding to rapid changes in light level.

The foregoing objects are achieved in the present invention wherein there is provided a photocell connected to cascaded, variable gain amplifiers wherein the response time of each amplifier is short while, at the same time, the overall gain of the amplifiers is at least as great as that provided in the prior art for measuring low light levels. The photocell is operated in the current mode and the amplifiers act as current-to-voltage converter. The voltage is converted into a digital representation of voltage by data conversion means which operates continuously and provides, in addition, an output signal indicating that a measurement is being carried out and that the digital representation at that time may not be valid. Range changing circuitry is also provided for maintaining the voltage input to the data converter within predetermined limits.

BRIEF DESCRIPTION OF THE DRAWINGS

A more complete understanding of the present invention can be obtained by considering the following detailed description in conjunction with the accompanying drawings, in which.

DESCRIPTION OF THE PREFERRED EMBODIMENT

Figure 1:
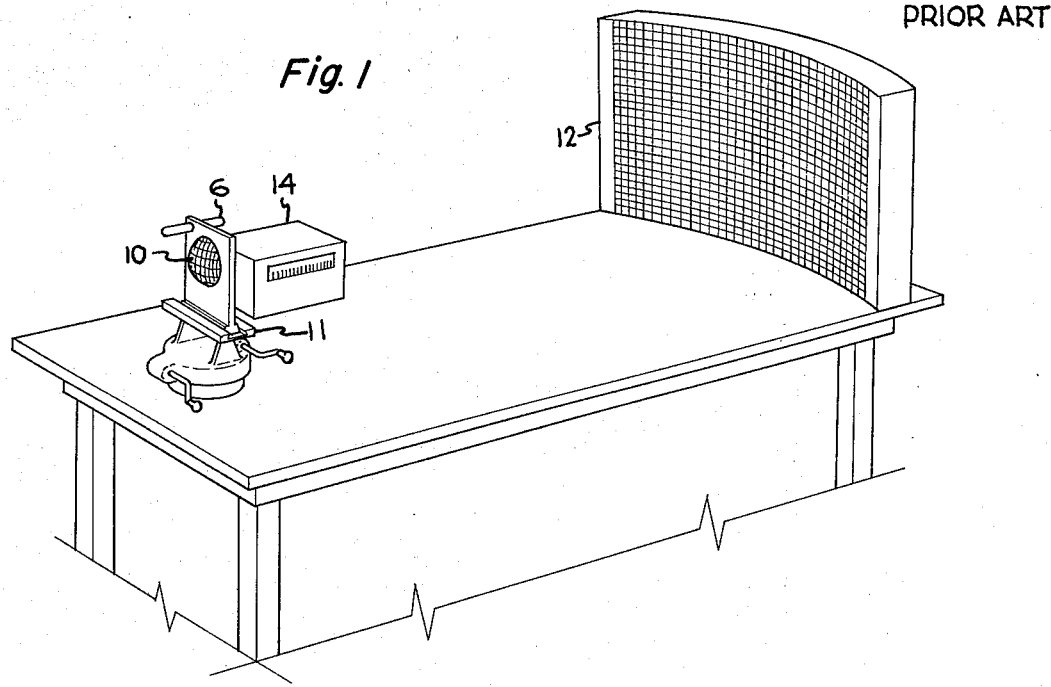
FIG. 1 illustrates a manual photometric system of the prior art.

Referring to FIG. 1, a typical counter-manual photometric system of the prior art comprises a lamp under test 10 held in a mount 11 capable of rotation about two axes. The headlamp is positioned by a collimated beam from source 6 projected onto screen 12. The beam from lamp 10 passes to a photocell (not shown) a fixed, known distance from lamp 10. The current from the photocell is monitored on galvanometer 14 and, as each reading is taken, it is converted by way of a table to the corresponding candlepower. Mount 11 changes the position of the beam from lamp 10, typically in increments of ½°, both vertically and horizontally. A reading is taken at each of the positions, and the positions together are plotted to form an isocandle diagram as illustrated in FIG. 2.

Figure 2:
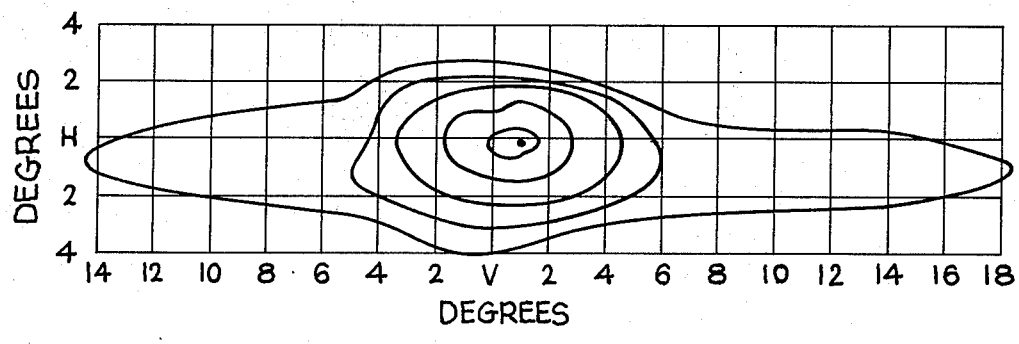
FIG. 2 illustrates a typical isocandle plot for a sealed beam headlamp.

As can be seen by inspection of FIG. 2, a typical headlamp produces a beam pattern having a substantial spread in the horizontal plane and a much smaller spread in the vertical plane. The particular values given in FIG. 2 for the isocandle curves are by way of example only and are typical of the high beam of an automotive headlamp.

Figure 3:
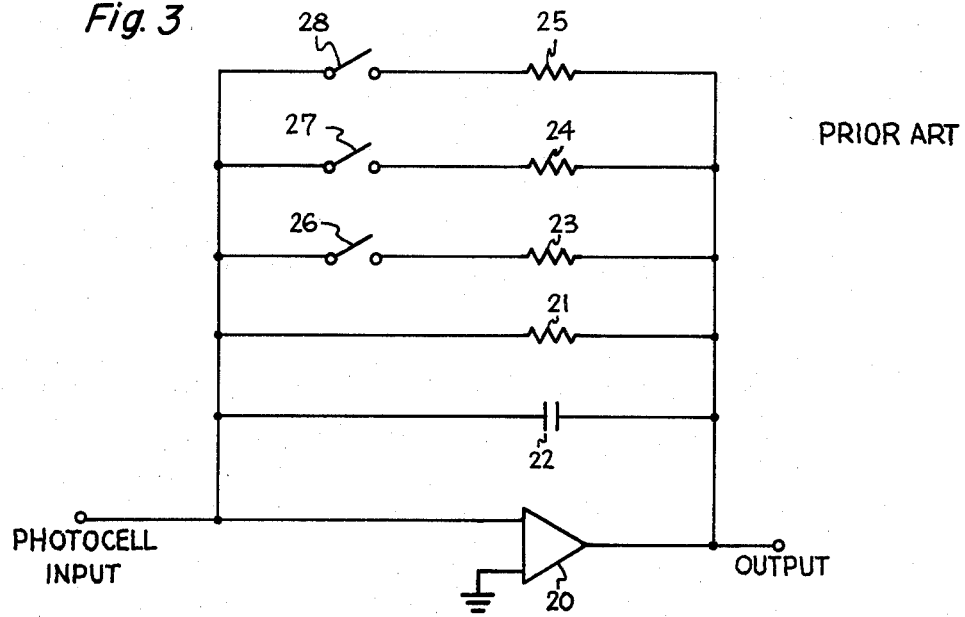
FIG. 3 illustrates a current-to-voltage converter of the prior art.

FIG. 3 illustrates a photocell amplifier as utilized in the prior art. Typically, the photocell is coupled to one input of amplifier 20 which has a plurality of feedback resistors, 21, 23, 24, and 25, interconnecting the output to the input to provide negative feedback, thereby reducing the overall gain of the amplifier. In addition, capacitor 22, which represents both a discrete component and the capacitance of amplifier 20, is provided in the feedback path to control the time constant of the amplifier.

This is known as current mode operation in which the operational amplifier 20 acts as a current-to-voltage converter by incorporating feedback to null out any voltage developed at the input to amplifier 20; the amplifier must drive a current through the feedback resistors equal in magnitude to that provided by the photocell. In order to do this, the output voltage of the amplifier must equal the photocell current times the feedback resistance.

At the lowest range of light level, the magnitude of the feedback resistance is a maximum, typically 10 megohms. Range changes are effected by switching in one or more of resistances 23–25 by way of switches 26–28, respectively. Typically, the range is changed by progressively switching in additional resistors to reduce the equivalent resistance of the feedback circuit, generally in steps of an order of magnitude (i.e., by a factor of 10). In the lowest range, with a feedback resistor on the order of 10 megohms, the time constant of the feedback network becomes considerable. For example, with a capacitor on the order of 1 microfarad, the time constant of the feedback network is 10 seconds. Actually, the "settling time", i.e., the time it takes amplifier 20 to produce an output voltage proportional to input current within a predetermined error, is considerably longer since it is understood that time constant refers to the time it takes an RC circuit to achieve 0.63 times the final value, representing an error of 37 percent. For this reason, digital luxmeters of the prior art have been too slow to use on-line with a digital computer.

Figure 4:
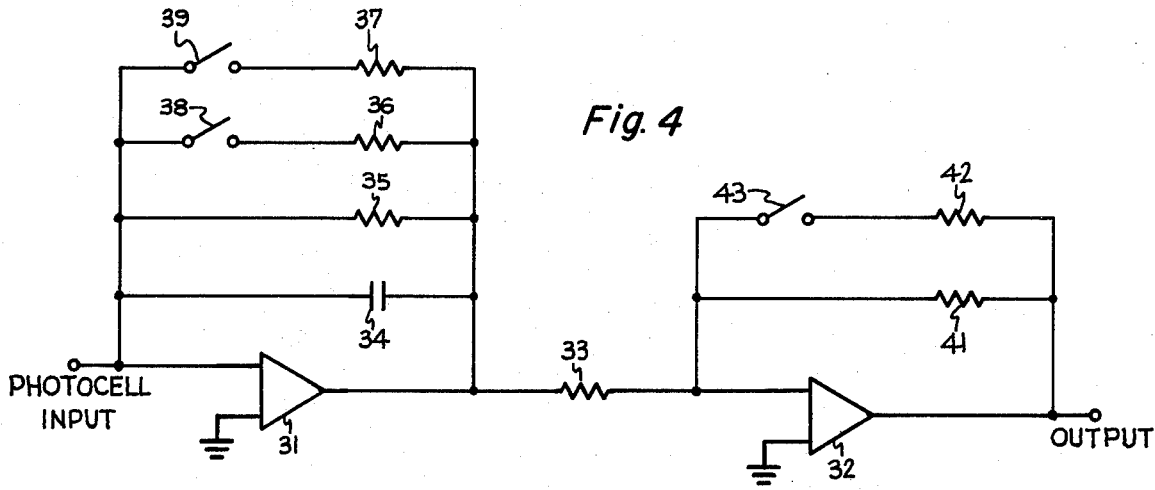
FIG. 4 is a diagram of the current-to-voltage converter useful in the present invention.

FIG. 4 illustrates a photocell amplifier in accordance with the present invention in which cascaded amplifiers are utilized to provide the necessary gain for low light levels while, at the same time, having faster response time to enable the luxmeter to be utilized with a computer. Specifically, the preferred embodiment of the photocell amplifier comprises two operational amplifiers 31 and 32 interconnected by resistor 33. Operational amplifier 31 has capacitor 34 and resistors 35–37 in the feedback path thereof. Connected in series with resistors 36 and 37 are switches 38 and 39, respectively. Operational amplifier 32 is provided with feedback resistors 41 and 42. Series-connected with resistor 42 is switch 43.

In operation, the number of ranges over which operational amplifier 31 must operate is less than that provided by the single amplifier of the prior art. Additional operating range coverage is provided by cascaded operational amplifier 32. Considered separately, operational amplifiers 31 and 32 function in a manner similar to that of operational amplifier 20; that is, the gain is varied by varying the effective resistance in the feedback path by selectively switching in parallel resistances to reduce the effective resistance of the feedback path, thereby decreasing the gain of the operational amplifier. Considered together, operational amplifiers 31 and 32 have the range changing functions divided between them so that the maximum gain provided by each individual amplifier need not be as great as required of the single operational amplifier of the prior art. Thus, the feedback resistance in each amplifier need not be as large and the time constant of the feedback path is reduced.

Figure 5:
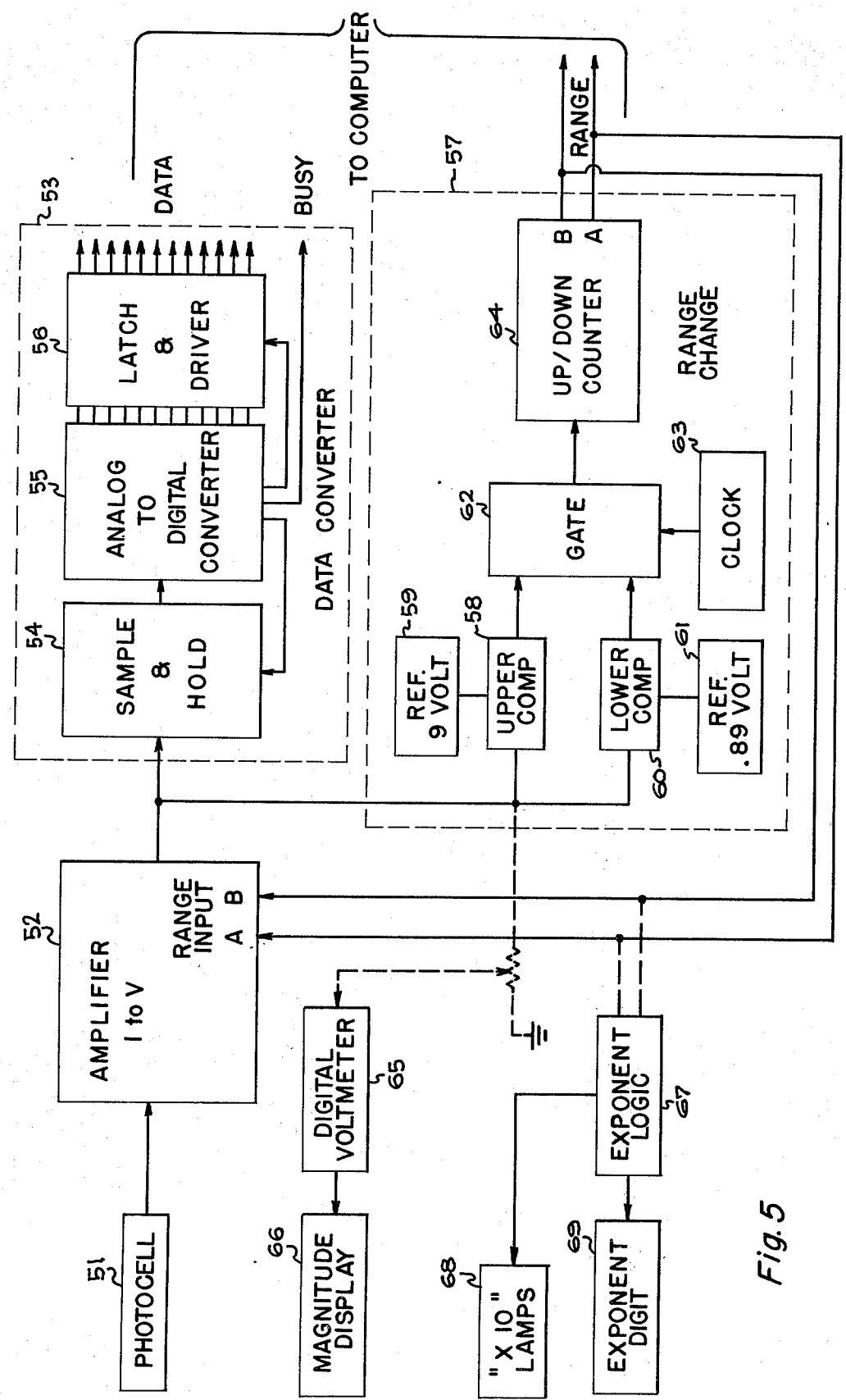
FIG. 5 is a block diagram of a complete luxmeter in accordance with the present invention.

FIG. 5 illustrates a general block diagram of a complete digital luxmeter in accordance with the present invention. Specifically, the luxmeter comprises a photocell 51, e.g., an Optronik Cos λ photocell, coupled to the input of a current-to-voltage conversion amplifier 52, a data converter 53 coupled to the output of the current-to-voltage amplifier for converting the output voltage into a digital representation of that voltage. Data converter 53 generally comprises a sample-and-hold circuit 54, an analogue-to-digital converter 55, and a latch and driver circuit 56. In a preferred embodiment of the present invention, analogue-to-digital converter 55 provides an output signal to the computer to indicate to the computer that a value update is taking place and that the analogue-to-digital converter's output during the transfer of values to the latches may not be complete and should be ignored until completed. A detailed description of this "busy signal" is provided below in the description of FIG. 7.

Also connected to the output of amplifier 52 is range change circuitry 57 for providing a coded output signal representative of the range in which amplifier 52 is operating. Range change circuitry 57 comprises an upper limit comparator 58 having one input thereof connected to a reference voltage 59 and the other input thereof connected to the output of amplifier 52. A lower limit comparator 60 has one input thereof connected to reference voltage 61 and the other input thereof connected to amplifier 52. The outputs from comparators 58 and 60 are coupled to gate 62 for controlling the flow of clock pulses from clock 63 to up-down counter 64. When the output voltage of amplifier 52 crosses either limit, gate 62 causes up-down counter 64 to either increase or decrease the count thereof by one count. The output from up-down counter 64 is applied to the range input control of amplifier 52 to change the feedback resistance of one of the amplifiers thereof to bring the output voltage within the range set by range change circuit 57. The output from up-down counter 64 is coupled, along with the data and busy signals from data converter 53, to a suitable computer where the binary data from the luxmeter is converted into a reading of candlepower.

Since the photocell is operating in a current mode, the output thereof is linearly proportional to incident lux. The current-to-voltage conversion by amplifier 52 is linear and thus produces output voltage proportional to lux. Data converter 53 may be considered a portion of a digital voltmeter, producing a binary indication of the voltage input. The conversion of the binary indication of current value and range value to a decimal indication of candlepower is simply multiplication by a constant after a binary-to-decimal integer conversion is accomplished by the computer (assuming a constant distance between the photocell and the source of illumination).

Since the unit "lux" is a measure of illumination in lumens per square meter, candlepower can be calculated as equal to $9.289 \times 10^{-2} \times (lux) \times (d)^2$, where the distance $d$ is in feet. The $9.289 \times 10^{-2}$ converts square feet to square meters.

The binary number at the output of data converter 53 is a binary representation of the current through photocell 51. The value for lux to be utilized in the foregoing calculation of candlepower is dependent upon the conversion constant of the particular photocell. For the Optronik Cos λ photocell noted above, this constant is $1.49 \times 10^{-7}$ amperes per lux. Thus, the computer must multiply at the binary number output from data converter 53 by the binary equivalent of the reciprocal of $1.49 \times 10^{-7}$, i.e., $6.71 \times 10^{-6}$. This conversion is readily done by virtually any digital computer known in the art. The range output from up-down counter 64 provides the computer with data for positioning the decimal point.

As illustrated in FIG. 5, one may optionally provide digital voltmeter 65 and display 66 for reading out incident lux directly. Also provided are exponent logic 67, indicator lamp 68 and digital display 69 for indicating the order of magnitude of the incident lux. Thus, with these added elements, well known per se in the art, the system of FIG. 5 may be utilized as a complete, free-standing luxmeter. The conversion constant of the photocell is provided by potentiometer 70 such that the input to the digital voltmeter is 0.671 times the applied voltage (the gain switching of the amplifier corrects for the decimal point).

Figure 6:
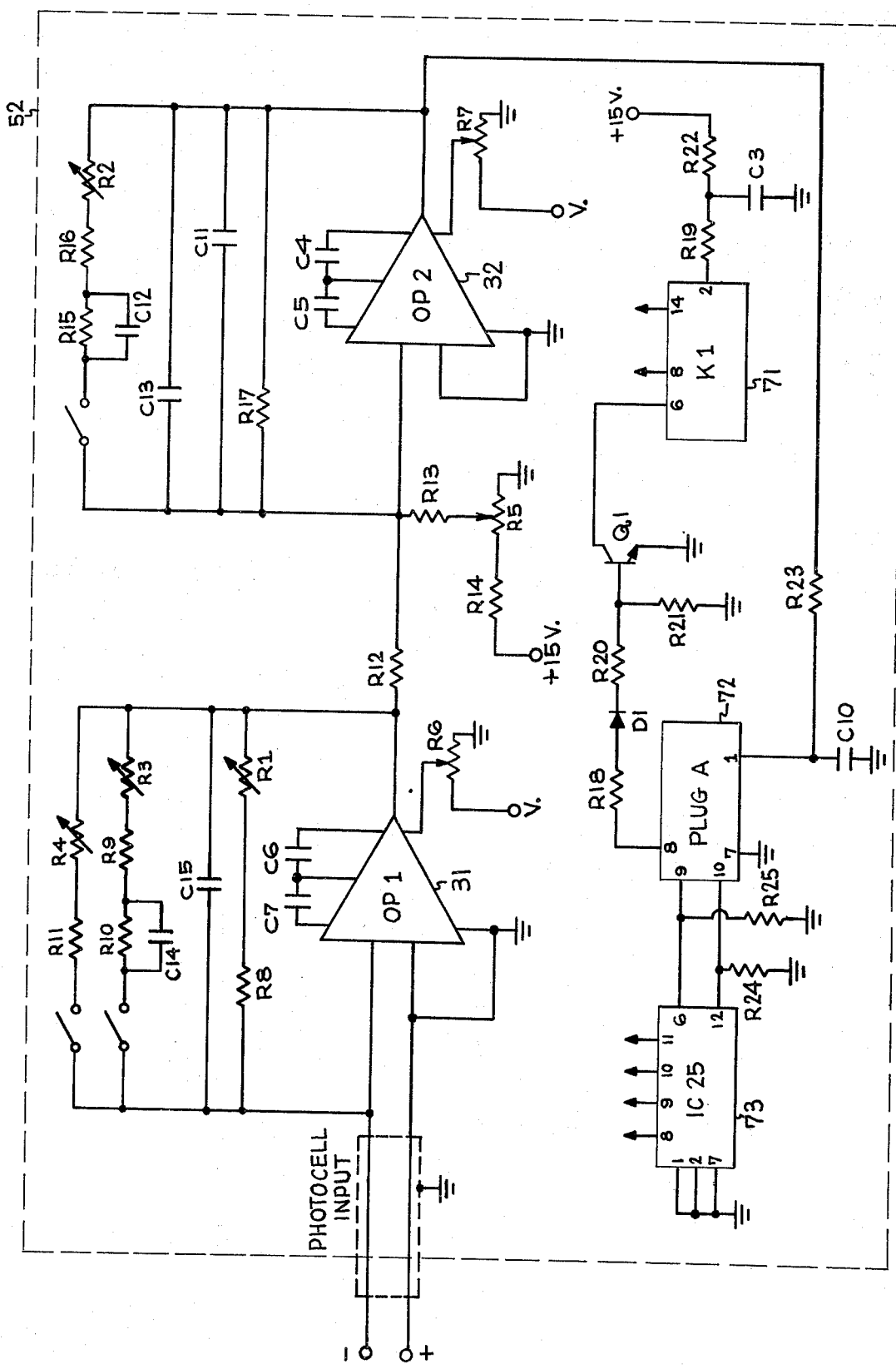
FIG. 6 is a schematic diagram of a preferred embodiment of the current-to-voltage converter in accordance with the present invention.

FIG. 6 is a schematic diagram of amplifier 52. Operational amplifiers 31 and 32 function as previously described in conjunction with FIG. 4. Operational amplifier 31 is connected as a current-to-voltage converter, having a feedback resistance (adjusted by R1) of exactly 1 megohm. The overall feedback resistance can be reduced to exactly 100 kilohms by solid state switch 73 closing the connection between pins 8 and 9 thereof. The resistance of the feedback circuit can be further reduced to exactly 10 kilohms by switch 73 closing the connection between pins 10 and 11 thereof. Solid state switch 73 may comprise any suitable device and, as a specific example, comprises a Motorola MC14016 quad analogue gate. This circuit is driven digitally from the range logic by way of connector 72. In the feedback loop, capacitors C14 and C15 help stabilize the amplifier, while potentiometer R6 is an amplifier balance adjustment.

Operational amplifier 32 acts as a voltage amplifier having a gain of either 1 or 10. The ratio of the resistances of resistors R17 and R12 is set to exactly 10 to 1, thereby giving a voltage gain of 10. The voltage gain is reduced to exactly one by switching in another resistance in the feedback path of operational amplifier 32, for example, by way of a solid state relay 71. Resistors R5, R13, and R14 provide an external bias adjustment to offset the thermocouple effect produced by the photocell connections. The output signal from amplifier 52 is coupled to the rest of the circuitry by way of pin 1 of connector 72. The sequence for switching, in the order of decreasing sensitivity, is: (1) all switches open, (2) relay 71 closes the connection between pins 8 and 14 thereof, (3) solid state switch 73 closes the connection between pins 8 and 9 thereof, and (4) solid state switch 73 closes the connection between pins 8 and 10 thereof. In this manner, four ranges are provided in which each range is ten times the preceding range.

The actual range over which amplifier 52 operates within a predetermined accuracy encompasses a variation in current of six orders of magnitude. This is due to the linearity and accuracy of the amplifiers and the accuracy of the data converter, described in detail in connection with FIG. 7. The additional two orders of magnitude are obtained at the lower end of the current range and may best be understood by considering the following example. If the maximum current is arbitrarily set at one, then the uppermost range covers 0.1 to 1.0. The succeeding three ranges are thus: 0.01–0.1, 0.001–0.01, and 0.0001–0.001. However, while it is customary to eliminate right-hand zeros from the statement of a number, the operational amplifiers and data conversion circuitry are actually considerably more accurate, such that there are an additional two orders of magnitude over which one can specify current within an accuracy of ±1 count. The circuitry of the present invention specifies current with an accuracy of three digits (in decimal notation). Thus, one can extend the range of coverage downward two decades, and maintain useful accuracy (within 10 percent or better) in measuring extremely low light levels.

By way of example only, Table I lists the various circuit elements shown schematically in FIG. 6.

TABLE I

| | | |
|---|---|---|
| OP1 | Analogue Devices | No. 234L |
| OP2 | Analogue Devices | No. 234J |
| K1 | Teledyne | No. 640-1 |
| IC25 | Motorola | MC14016CL |
| Q1 | GE | 2N3414 |
| D1 | GE | 1N5060 |
| R1, R3 | 10Kω potentiometer | |
| R2, R4 | 1Kω " | |
| R5 | 100 ω " | |
| R6, R7 | 100Kω " | |
| R8 | 1Mω 1% ½W | |
| R9, R11, R12, R15 | 10Kω 1% ½W | |
| R10, R14, R17 | 100Kω 1% ½W | |
| R13 | 200Kω 1% ½W | |
| R16 | 1K 1% ½W | |
| R18 | 33K 5% ½W | |
| R19 | 270 ω 5% ½W | |
| R20 | 15Kω 5% ½W | |
| R21 | 100Kω 5% ½W | |
| R22 | 100 ω 5% ½W | |
| R23 | 10 ω 5% ½W | |
| R24, R25 | 1Mω 5% ½W | |
| C3, C4, C5, C6, C7 | 1 mf 50V | |
| C10 | 0.01 mf 50V | |
| C11 | 0.0022 mf 100V | |
| C12 | 0.0015 mf 100V | |
| C13 | 100 pf 600V | |
| C14, C15 | 220 pf 600V | |

Figure 7:
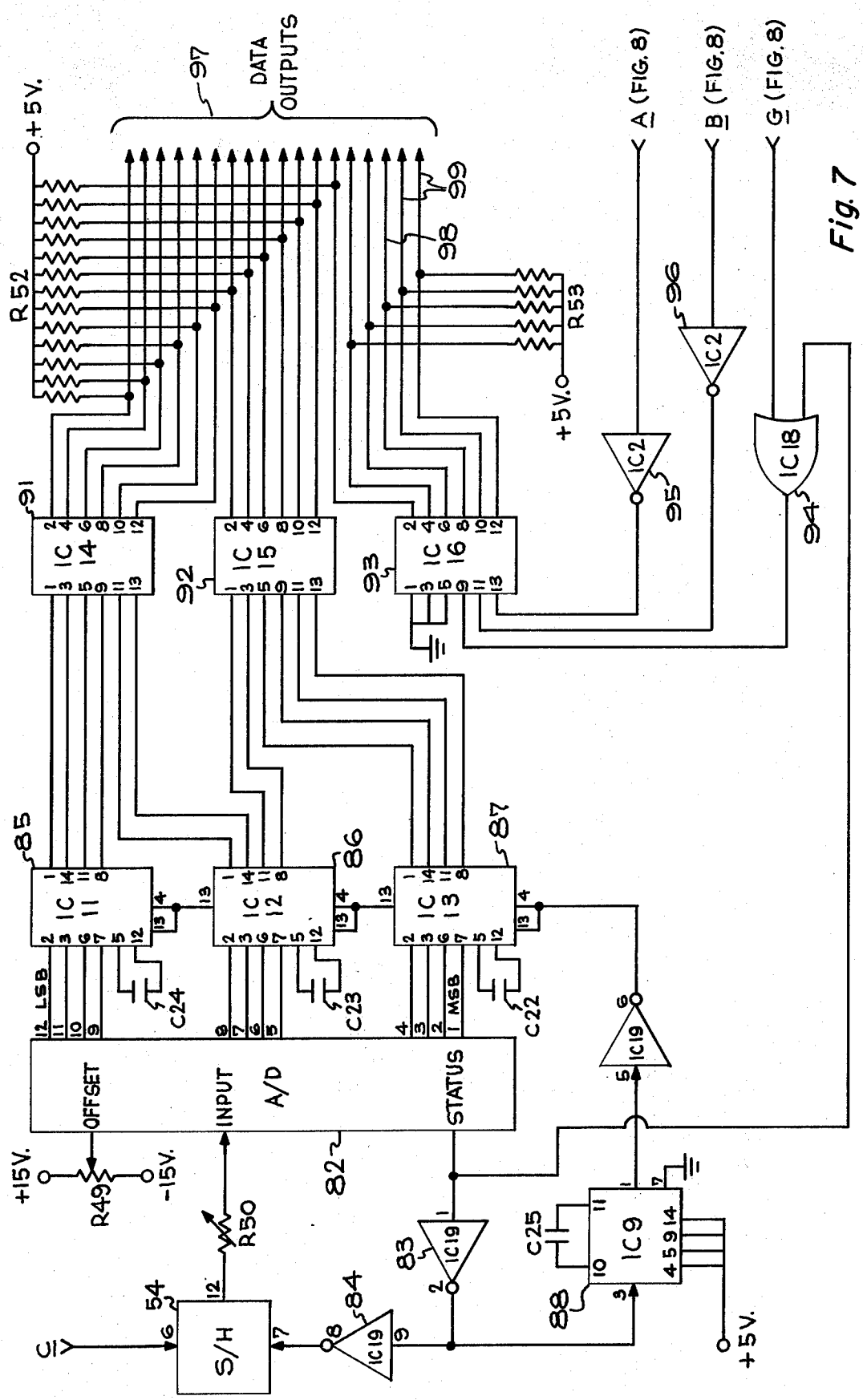
FIG. 7 is a schematic diagram of a preferred embodiment of the data conversion portion of a luxmeter in accordance with the present invention.

FIG. 7 is a schematic diagram of the data conversion circuit as utilized in the present invention. Data converter 53 comprises a sample-and-hold circuit 54 coupled by way of input C to plug 1 of connector 72. The output of sample-and-hold circuit 54 is coupled by way of rheostat R50 to the input of digital-to-analogue converter 82. Sample-and-hold circuit 54 is controlled by digital-to-analogue converter 82 by way of the status output and inverters 83 and 84. The outputs from digital-to-analogue converter 82 are valid for only a few microseconds and must be stored in a temporary memory during conversion to obtain a continuous output.

Latch circuits 85–87 provide this function and are controlled by the status output of digital-to-analogue converter 82 by way of inverter 83, single shot multivibrator 88, and inverter 89. As illustrated in FIG. 7, pins 4 and 13 of latch circuits 85–87 are all connected together to the output of inverter 89. In order to interface with a computer, drivers 91 and 92 couple the outputs of latch circuits 85–87 to output data lines 97. Driver circuits 91 and 92 comprise what is known as open collector drive for data lines 97.

Open collector drive means that the outputs of drive circuits 91–93 comprise the collectors of a plurality of transistors, the bases of which are connected to the input terminals to the drive circuits. Thus, drive circuits 91–93 are actually only portions of a circuit and isolate the latch circuitry from the computer. A suitable power supply and additional circuitry in the computer completes the circuits with the transistors in drive circuits 91–93.

In order to provide some means for testing the output of data converter 53, a plurality of load resistors R52 and R53 are connected between data lines 97 and a source of potential, e.g., 5 volts. Resistors R52 and R53 are sufficiently large so that in operation the outputs on data lines 97 are not affected. However, the supply voltage and load resistors R52 and R53 provide a sufficient voltage output to test the circuitry. The outputs from latch circuits 91–93 are inverted logic, i.e., a low output is obtained when the input is high.

Additional logic is provided to indicate the range and a busy condition within converter 53. Specifically, latch circuit 93 is driven, by way of inverters 95 and 96, by the binary output of the range change circuitry illustrated in FIG. 8. In addition, the busy signal provided by the status output of analogue-to-digital converter 82 is coupled by way of OR gate 94 to another input of latch circuit 93. Thus, line 98 of output data lines 97 comprises the busy signal output while lines 99 comprise the range output to the computer. By utilizing a busy signal to the computer, the operation of data converter 53 is continuous, and the computer is simply told to ignore data until the conversion is completed. This provides a faster conversion, avoids transients, and reduces the settling time compared to that obtained if the data converter were operating under the control of the external computer.

By way of example only, Table II lists the various circuit elements shown schematically in FIG. 7.

TABLE II

| S/H | Analogue Devices | SHA-5 |
|---|---|---|
| A/D | Philbrick | No. 4103 |
| IC2 | Motorola | MC14009CL |
| IC9 | TI | SN74121N |
| IC11, IC12, IC13 | TI | SN7475N |
| IC14, IC15, IC16 | TI | SN7417N |
| IC18 | TI | SN7402N |
| IC19 | TI | SN74H04N |
| R49 | 50Kω | |
| R50 | 100 ω | |
| R52, R53 | 15K | |
| C22, C23, C24 | 4.7 mf, 50V | |

Figure 8:
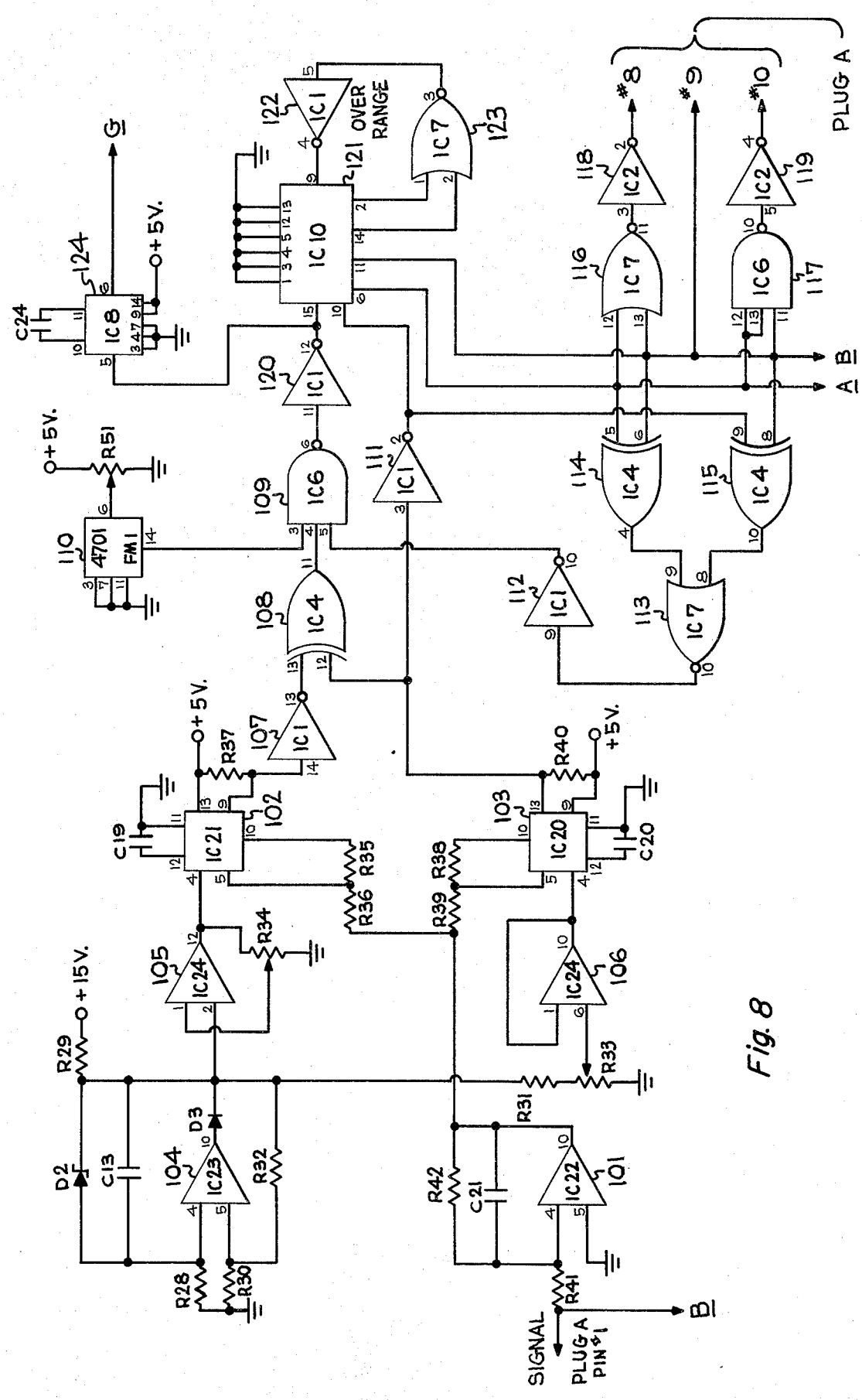
FIG. 8 is a schematic diagram of a preferred embodiment of the range-changing portion of a luxmeter in accordance with the present invention.

FIG. 8 illustrates a preferred embodiment of the range change circuitry in accordance with the present invention. Specifically, the input signal from the output of amplifier 52 is coupled by way of operational amplifier 101 through a hysteresis network comprising resistors R35, R36, R38, and R39 to the inputs of comparators 102 and 103. The hysteresis network assures stability at the threshold of comparators 102 and 103 such that, if the threshold of one of these comparators is exceeded, the voltage must drop a predetermined amount below that threshold before another switching signal will be generated. Thus, oscillation at the threshold level is prevented.

The other inputs of comparators 102 and 103 are connected, respectively, to high and low reference voltages provided by operational amplifiers 104–106. Operational amplifier 104 provides a stable reference voltage by incorporating a reference zener diode, D2, in the feedback circuit of operational amplifier 104. The regenerative action of the feedback path causes a specific zener current to flow through the zener diode, thereby further stabilizing the reference voltage. Potentiometers R33 and R34 provide the upper and lower reference voltages, respectively, for operational amplifiers 105 and 106.

The input signal is compared in comparators 102 and 103 which provide high and low outputs, respectively, when the incoming signal is within the range determined by the high and low reference input voltages. When either of the boundaries is exceeded, the output of the appropriate comparator changes state causing a pulse to be applied to an up-down counter.

Specifically, the output of comparator 102 is inverted by inverter 107 and combined with the output from comparator 103 in exclusive-OR gate 108. The output of exclusive-OR gate 108 is coupled as one input to NAND gate 109. One other input to NAND gate 109 is provided by a free-running oscillator 110. The remaining input to NAND gate 109 is provided by inverter 112 which is coupled to the output of up-down counter 121 by OR gate 113 and exclusive-OR gates 114 and 115. (The use of exclusive-OR gates is merely to reduce the parts count, not for the function per se; i.e., these gates are from partially used integrated circuits, OR gates would work as well.) The output of NAND gate 109 is coupled by inverter 120 to one input of up-down counter 121. The decision as to whether to count up or down is determined by the lower level voltage comparator 103 which is coupled to another input of up-down counter 121 by way of inverter 111. Depending upon the output level of inverter 111, the clock pulse selected by NAND gate 109 is either added to or subtracted from the contents of up-down counter 121. Since up-down counter 121 need only count to a total of 4, overrange circuitry is provided to inhibit any count greater than 4. The output from counter 121 is decoded by OR gate 116, NAND gate 117, and inverters 118 and 119 and applied, by way of plug A, to the range control circuitry in amplifier 52.

Monostable flip-flop 124, coupled to the output of inverter 120, provides the other input to OR gate 94 illustrated in FIG. 7, thereby providing a busy signal to the computer during the range change operation. Thus, during either a range change operation or during the digital data transfer from A/D converter 82, an output signal is applied to the computer indicating that the data of the rest of the data lines may not be valid.

By way of example only, Table III lists the various circuit elements shown schematically in FIG. 8.

TABLE III

| IC1, IC2 | Motorola | MC14009CL |
|---|---|---|
| IC4 | '' | MC14507CL |
| IC6 | '' | MC14023CL |
| IC7 | '' | MC14001CL |
| IC8 | TI | SN74121N |

TABLE III-continued

| | | |
|---|---|---|
| IC10 | Motorola | MC14156CL |
| IC20, IC21 | Burr Brown | 4082/03 |
| IC22, IC23 | TI | SN52741J |
| IC24 | Signetics | μA747F |
| D2 | Motorola | 1N829A |
| D3 | GE | 1N5060 |
| R28 | 82.5 ω 1% ½W | |
| R30 | 1Kω 1% ½W | |
| R31 | 49.9K 1% ½W | |
| R32 | 10Kω 1% ½W | |
| R33, R34 | 10Kω | |
| R35, R38 | 2.7Mω 5% ½W | |
| R36, R37, R40 | 10Kω 5% ½W | |
| R39 | 1Kω 5% ½W | |
| R41 | 10Kω 1% ½W | |
| R51 | 20Kω | |
| C13 | 100 pf 600V | |
| C19, C20 | 0.01 mf 100V | |
| C21 | 0.0047 mf 100V | |
| C24 | 4.7 mf 50V | |

Figure 9:
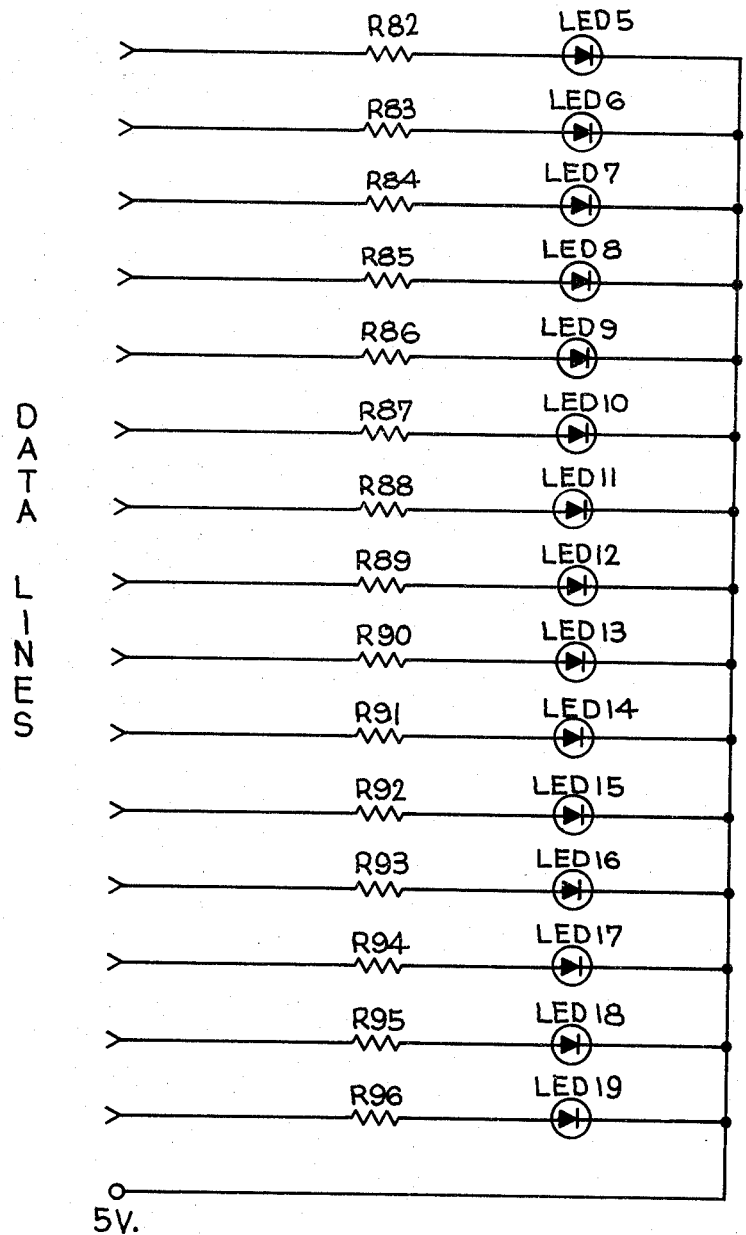
FIG. 9 illustrates a circuit useful for testing the luxmeter of the present invention and for coupling same to a computer.

FIG. 9 illustrates a test circuit that can be utilized to provide a visual indication of the status of data lines 97. Specifically, a plurality of light-emitting diodes, LED 5 – LED 19, are connected one to each data line by way of load resistances R82–R96. When connected to data lines 97, the circuit of FIG. 9 provides a visual indication of the outputs of driver circuits 91–93. As previously noted, the outputs of driver circuits 91–93 are logically inverted. However, by way of the connection to LED 5–LED 19, the information is provided in its proper sense. For example, if a busy signal were obtained from the output of OR gate 94, a high level input signal would be coupled to pin 9 of driver 93. The collector of the transistor connected to pin 9 of driver 93 is coupled by way of pin 8, line 98, to LED 17. Since the high level input signal on pin 9 turns on this transistor, light is produced by LED 17, thereby properly indicating the logic level of OR gate 94.

There is thus provided by the present invention a digital luxmeter that is fast, accurate, and capable of interfacing on-line with a computer. Analogue-to-digital converter 82 typically provides $3 \times 10^4$ conversions per second with an accuracy of 12 bits (in binary form) which, combined with the range signal, provides a 14-bit output covering a total input range of six orders of magnitude. As a specific example, a digital luxmeter constructed in accordance with the above Tables had the following ranges and resolution:

| Range | (A B) | Max. | Lux Min. | Resolution |
|---|---|---|---|---|
| 3 | (11) | 6710 | 604 | 1.607 |
| 2 | (01) | 604 | 60.4 | 0.1607 |
| 1 | (10) | 60.4 | 6.04 | 0.01607 |
| 0 | (00) | 6.04 | 0.0016 | 0.0016 |

This corresponds to a candlepower range (at 60 feet) of $2.24 \times 10^6$ to 0.539 candlepower. Noise is negligible in ranges 2 and 3. In range 1, noise is approximately 0.003 lux, while in range zero, noise is approximately 0.012 lux. The error rate for the electronics is less than 0.04 percent. However, the system accuracy is affected by the photocell which has a specified error of equal to or less than 0.1 percent. Further, as previously noted, separate means can be provided for providing a free-standing unit in which the value of the incident lux is read on a front panel meter. This separate, visual indication of lux can be completely independent of the data conversion provided for the computer. By utilizing the luxmeter of the present invention, isocandle plots can be greatly speeded up by simply scanning the beam rather than positioning the beam at a plurality of points.

Having thus described the present invention, it will be apparent to those of skill in the art that various modifications can be made within the spirit and scope of the present invention. For example, while a preferred embodiment of the present invention utilizes two operational amplifiers in which the first has three ranges and the second, two, it is understood that various other combinations can be utilized. Similarly, other switching formats for varying the gain of the amplifiers can be used, e.g., switch out the present resistor and switch in one with a different value. While the output on data lines 97 is described as binary, other data formats can be used, e.g., binary coded decimal (BCD). Also, instead of using a separate digital voltmeter, e.g., Weston 1295, one may convert the output of the data converter to a decimal, numerical display. It is understood that while specific circuit components are given in the Tables above, this is by way of example only and not to be construed as limiting. Other suitable circuit elements may be used in implementing the present invention.

What I claim as new and desire to secure by Letters Patent of the United States is:

1. A digital luxmeter capable of operating on-line with a computer comprising:
   photocell means for converting incident light into electric current;
   amplifier means connected to said photocell for converting said current to a voltage, said amplifier means comprising:
   a first operational amplifier, having first controllable feedback means, connected to said photocell,
   a second operational amplifier, having second controllable feedback means, connected to the output of said first operational amplifier, and
   control means connected to said first and second controllable feedback means for varying the feedback of said first and second operational amplifiers;
   data conversion means coupled to said amplifier means for converting said voltage into a digital representation of said voltage; and
   range changing means coupled to the output of said amplifier means and to said control means for maintaining said voltage within predetermined limits.

2. The digital luxmeter as set forth in claim 1 and further comprising:
   means for providing a busy signal during data changes.

3. The digital luxmeter as set forth in claim 1 and further comprising:
   digital voltmeter means coupled to the output of said amplifier means for providing a visual readout of incident lux.

4. The digital luxmeter as set forth in claim 1 wherein the controllable feedback means of said operational amplifiers varies the gain thereof in decade steps.

5. The digital luxmeter as set forth in claim 4 wherein the gain of said first operational amplifier varies over a range of two steps and the gain of said second operational amplifier varies over a range of one step.

6. The digital luxmeter as set forth in claim 5 wherein said second operational amplifier has unity gain at its lowest gain.

* * * * *

UNITED STATES PATENT OFFICE
CERTIFICATE OF CORRECTION

PATENT NO. : 3,972,626
DATED : August 3, 1976
INVENTOR(S) : Edward L. Laskowski

It is certified that error appears in the above-identified patent and that said Letters Patent are hereby corrected as shown below:

On the front page, the inventor's name should be:

Edward L. Laskowski

*Signed and Sealed this*

Twenty-first Day of September 1976

[SEAL]

Attest:

RUTH C. MASON
*Attesting Officer*

C. MARSHALL DANN
*Commissioner of Patents and Trademarks*